(12) United States Patent
Kruse

(10) Patent No.: US 12,183,536 B2
(45) Date of Patent: Dec. 31, 2024

(54) X-RAY CATHODE FOCUSING ELEMENT

(71) Applicant: GE Precision Healthcare LLC, Wauwatosa, WI (US)

(72) Inventor: Kevin Kruse, Muskego, WI (US)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 468 days.

(21) Appl. No.: 17/558,408

(22) Filed: Dec. 21, 2021

(65) Prior Publication Data

US 2023/0197396 A1 Jun. 22, 2023

(51) Int. Cl.
| | |
|---|---|
| *H01J 35/06* | (2006.01) |
| *H01J 1/20* | (2006.01) |
| *H01J 3/02* | (2006.01) |
| *H01J 9/04* | (2006.01) |
| *H01J 35/14* | (2006.01) |
| *H01J 37/075* | (2006.01) |

(52) U.S. Cl.
CPC ............ *H01J 35/066* (2019.05); *H01J 3/027* (2013.01); *H01J 9/04* (2013.01); *H01J 35/14* (2013.01); *H01J 1/20* (2013.01); *H01J 37/075* (2013.01); *H01J 2235/068* (2013.01)

(58) Field of Classification Search
CPC .. H01J 35/066; H01J 3/027; H01J 9/04; H01J 2235/068
See application file for complete search history.

(56) References Cited

U.S. PATENT DOCUMENTS

| | | | | |
|---|---|---|---|---|
| 3,363,131 A | * | 1/1968 | Perry | H01J 35/066 378/138 |
| 4,320,323 A | * | 3/1982 | Magendans | H01J 35/105 216/33 |
| 4,868,842 A | | 9/1989 | Dowd | |
| 5,623,530 A | | 4/1997 | Lu et al. | |
| 6,480,572 B2 | | 11/2002 | Harris et al. | |
| 6,785,359 B2 | | 8/2004 | Lemaitre | |
| 6,968,039 B2 | | 11/2005 | Lemaitre et al. | |
| 7,352,846 B2 | | 4/2008 | Kuribayashi et al. | |
| 8,358,741 B2 | | 1/2013 | Grasruck et al. | |
| 2005/0086032 A1 | * | 4/2005 | Benitez | G02B 19/0004 703/1 |
| 2010/0079053 A1 | * | 4/2010 | Andrews | H01J 35/066 313/326 |

(Continued)

FOREIGN PATENT DOCUMENTS

| | | |
|---|---|---|
| CN | 211238151 U | 8/2020 |
| JP | 5420675 B2 | 7/1979 |

(Continued)

OTHER PUBLICATIONS

Wikipedia, Brazing, Published in 2010, From the Wayback Machine by Internet Archive. Retrieved from the Internet: <<https://web.archive.org/web/20100124094007/https://en.wikipedia.org/wiki/Brazing>>. (Year: 2010).*

(Continued)

*Primary Examiner* — Chih-Cheng Kao
(74) *Attorney, Agent, or Firm* — McCoy Russell LLP

(57) ABSTRACT

Various methods and systems are provided for a cathode of an X-ray imaging system. A method for fabricating the cathode comprises machining a plurality of focusing features on a focusing element and welding the focusing element to a base assembly.

13 Claims, 7 Drawing Sheets

(56) References Cited

U.S. PATENT DOCUMENTS

2016/0217965 A1* 7/2016 Canfield ............... H01J 35/045
2016/0254116 A1* 9/2016 Ukita .................... H01J 35/066
378/138

FOREIGN PATENT DOCUMENTS

| | | |
|---|---|---|
| JP | 2001297725 A | 10/2001 |
| JP | 5242842 B1 | 7/2013 |
| JP | 2021118129 A | 8/2021 |

OTHER PUBLICATIONS

CN 105575744 A and its English translation (Year: 2016).*
JP 2021-118129 A and its English translation (Year: 2021).*
Neculaes, V. et al., "Design and characterization of electron beam focusing for X-ray generation in novel medical imaging architecture," Physics of Plasmas, vol. 21, No. 5, May 2014, 9 pages.
EP application 22212785.4 filed Dec. 12, 2022—extended Search Report issued Aug. 16, 2023; 12 pages.
JP2021118129—English Abstract, Espacenet.com search Nov. 14, 2023; 1 page.
CN211238151U English abstract; Espacenet search results Aug. 1, 2023; 1 page.
EP application 22212785.4 filed Dec. 12, 2022—partial Search Report issued May 9, 2023; 12 pages.

* cited by examiner

X-RAY CATHODE FOCUSING ELEMENT

FIELD

Embodiments of the subject matter disclosed herein relate to a cathode for imaging systems, for example, X-ray imaging systems.

BACKGROUND

In an X-ray tube, ionizing radiation is created by accelerating electrons in a vacuum from a cathode to an anode via an electric field. The electrons originate from a filament of a cathode assembly with current flowing therethrough. The filament may be heated by the current flowing through it to liberate electrons from the cathode and accelerate the electrons toward the anode. Additional filaments heated by currents at different voltages may be used to focus the electron beam towards the anode, and to influence the size and position of the X-ray emitting spot. The cathode may be configured with additional focusing elements, such as a focusing architecture, for example, to further influence the size and position of the X-ray emitting spot.

BRIEF DESCRIPTION

In one embodiment, a method for fabricating a cathode for an imaging system comprises machining a plurality of focusing features on a focusing element and welding the focusing element to a base assembly. The focusing element is welded to the base assembly at weld features along a first edge, a second edge, a third edge, and a fourth edge of the base assembly, and welding is halted at each of a first curved space between the first edge and the second edge, a second curved space between the second edge and the third edge, a third curved space between the third edge and the fourth edge, and a fourth curved space between the fourth edge and the first edge.

It should be understood that the brief description above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE DRAWINGS

The present invention will be better understood from reading the following description of non-limiting embodiments, with reference to the attached drawings, wherein below:

FIGS. 2-5 are shown approximately to scale although other relative dimensions may be used.

DETAILED DESCRIPTION

Figure 1:
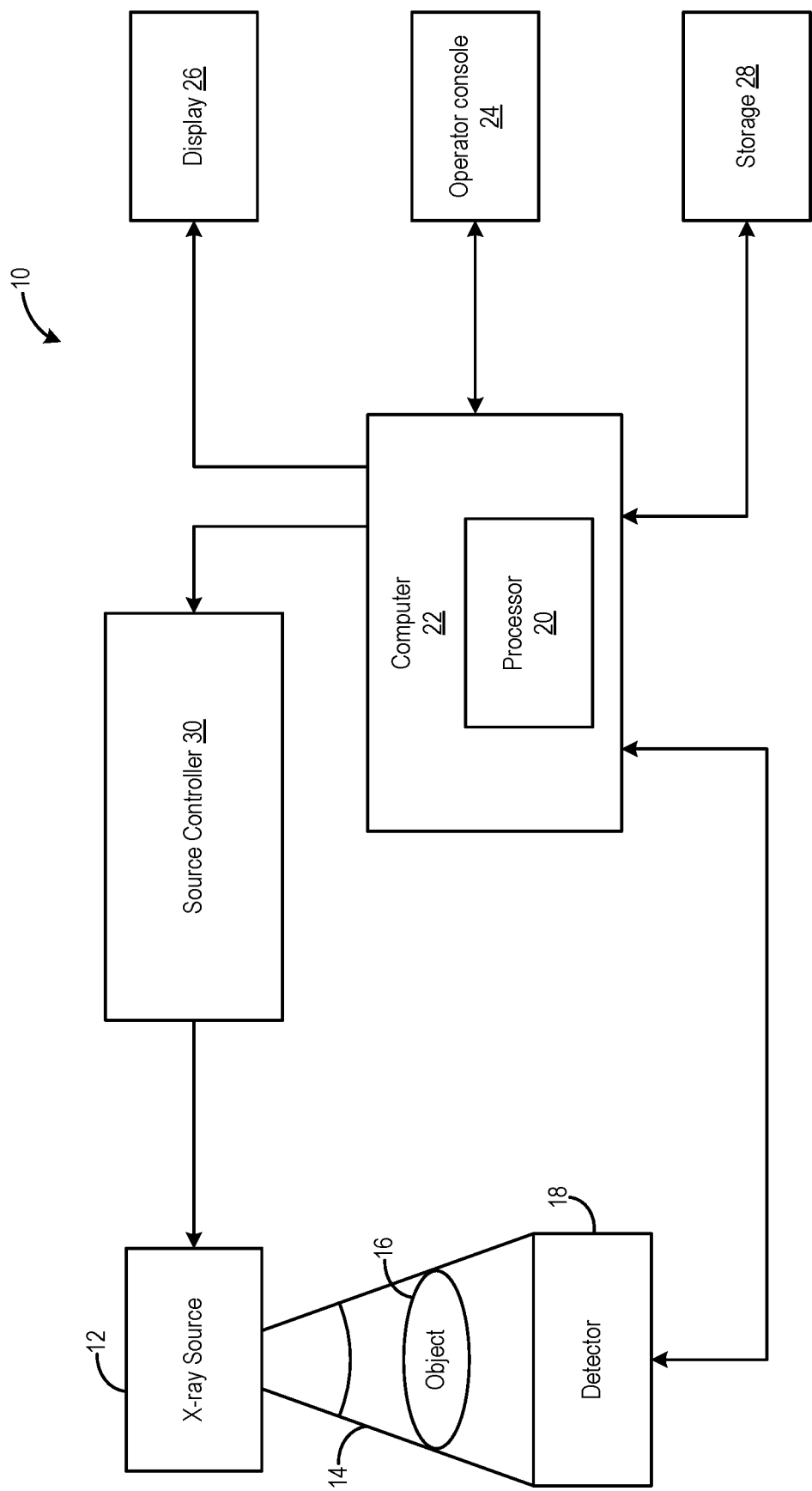
FIG. 1 shows a block diagram of an example of an imaging system.

The following description relates to various embodiments of methods and systems for a cathode of an imaging system, such as an X-ray imaging system. A method for fabricating a cathode for an imaging system comprises machining a plurality of focusing features on a focusing element and welding the focusing element to a base assembly. The resulting cathode includes the focusing element welded to the base assembly at weld features of the base assembly along a first edge, a second edge, a third edge, and a fourth edge, and gaps in welding at each of a first curved space between the first edge and the second edge, a second curved space between the second edge and the third edge, a third curved space between the third edge and the fourth edge, and a fourth curved space between the fourth edge and the first edge.

Smart cathodes are used in imaging systems, such as X-ray imaging systems, to provide focusing to coiled filaments and create essentially infinite focal spot shape sizes with electrode features. Smart cathodes may be manufactured by brazing together at least two base elements without focusing features or other cathode architecture, where at least two base elements are joined using a filler metal. Features which provide focusing for the electrode are then machined on the brazed elements, for example, using electrical discharge machining (EDM) at an assembly level. EDM may allow for multiple feature geometries with linear shapes (e.g., where planes of the geometries intersect at angles rather than curved geometries). Following EDM to create feature geometries, the resulting smart cathode may be cleaned. For example, surfaces of the smart cathode may be grit blasted to remove braze overflow and recast layers from the EDM process.

However, challenges exist with conventional methods of smart cathode manufacturing. For example, using EDM to machine focusing elements may generate focusing features with angled geometries, which may reduce a focusing range of the smart cathode and reduce high-voltage stability of the focusing features. Potentially sharp focusing features (e.g., due to angled geometries) may be positioned within a cathode cup or other shielding element, such that a height of the focusing features is less than a height of the cathode cup. Further, during cleaning of the smart cathode following brazing and EDM, some surfaces of the cathode to be cleaned may be blocked from a line of sight of grit blasting by focusing feature geometries. For example, a ceramic insulator used to separate a first voltage applied to a first portion of the smart cathode from a second voltage applied to a second portion of the smart cathode may be blocked from grit blasting by the focusing feature geometry, and thus not be cleaned. The aforementioned challenges may result in electron and/or voltage leaks, reduced lifetime of the smart cathode due to element degradation, and other challenges stemming from reduced insulation by the ceramic insulator. A method may thus be desired for manufacturing a smart cathode with increased high-voltage stability, increased useable lifetime, increased options for focusing feature geometries, and increased focusing ranges.

The following description relates to a cathode of an X-ray tube, wherein the X-ray tube may be included in an X-ray imaging system, an example block diagram of which is shown in FIG. 1. The X-ray imaging system may be an interventional radiography imaging system, a fluoroscopic imaging system, a mammography imaging system, a fixed or mobile radiography (RAD) imaging system, a tomographic imaging system, a computed tomography (CT) imaging system, and so on.

Figure 2:
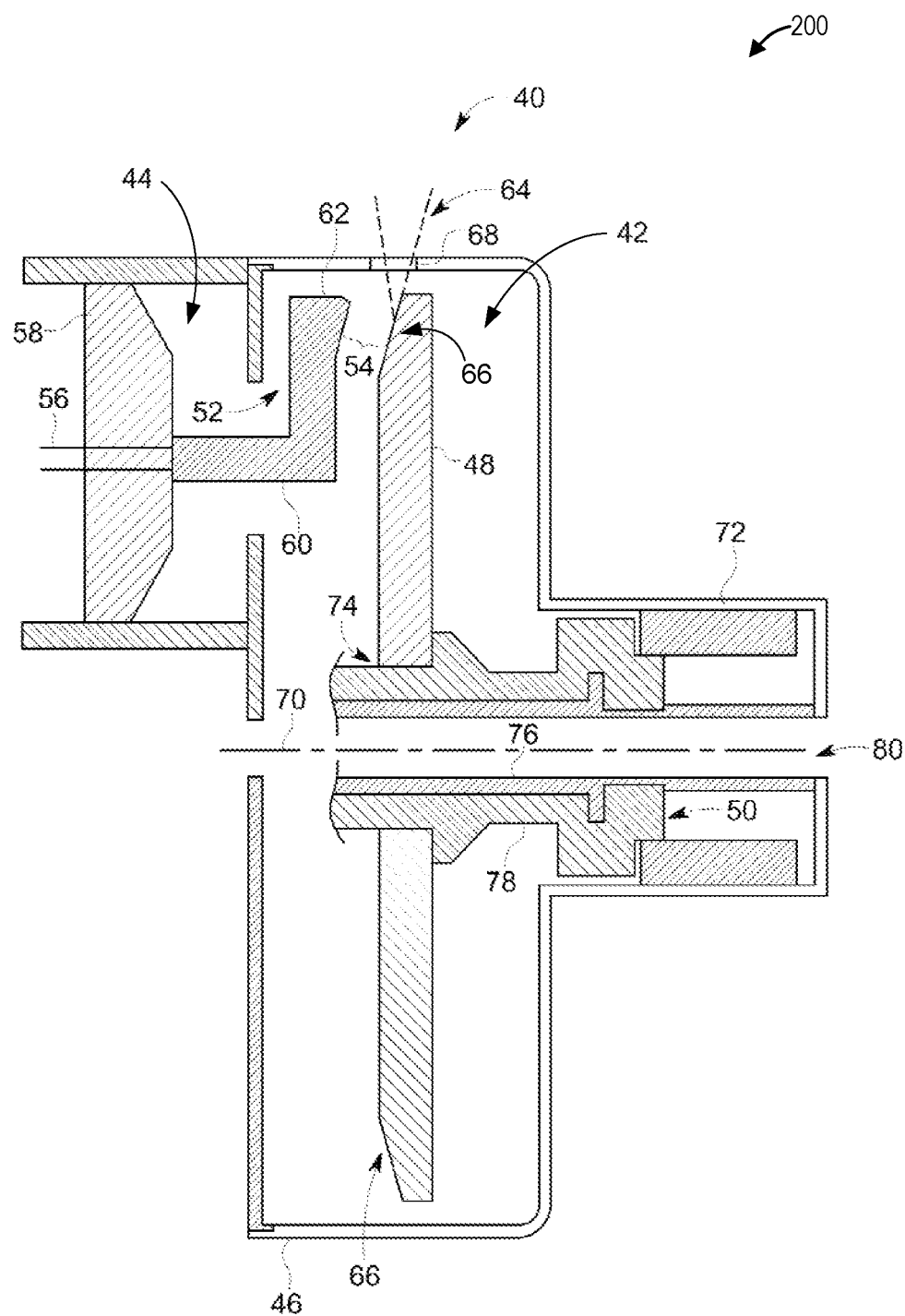
FIG. 2 shows a cross-sectional view of a portion of an X-ray system tube which may be included in the imaging system of FIG. 1.
Figure 2:
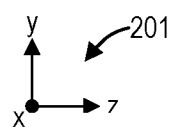
Figure 3A:
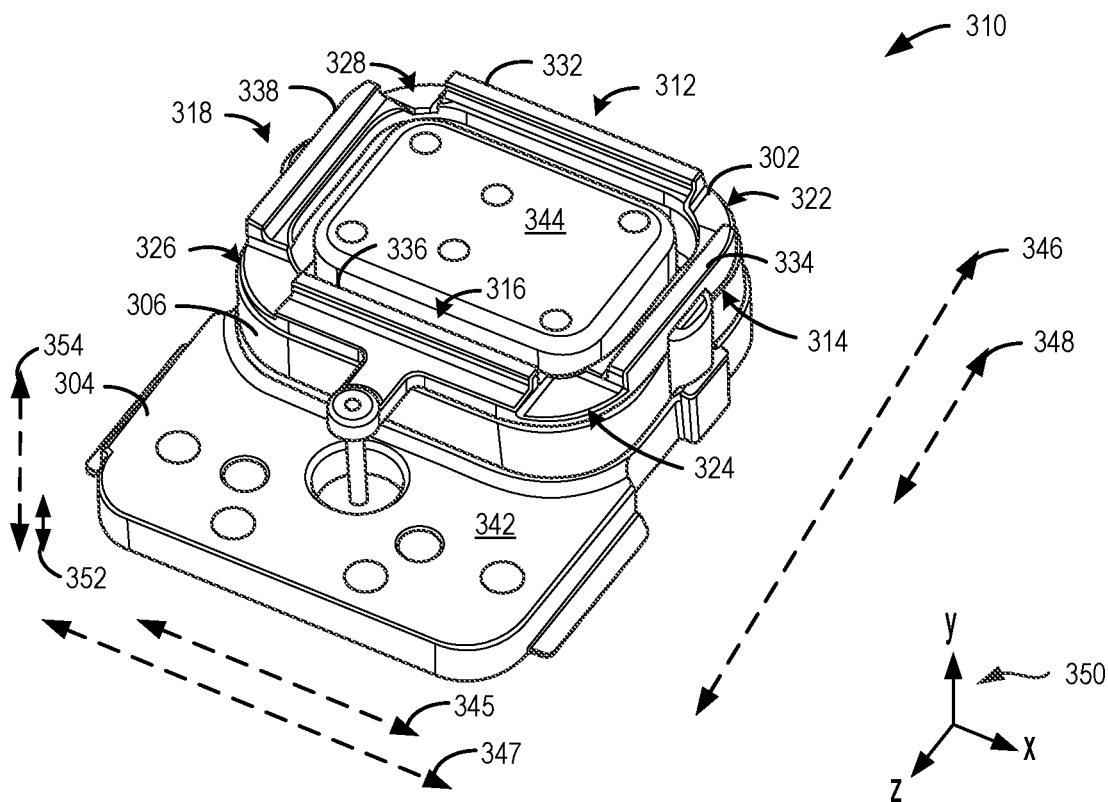
FIGS. 3A-C show a series of manufacturing stages of a cathode, which may be included in the X-ray system of FIG. 2.
Figure 3B:
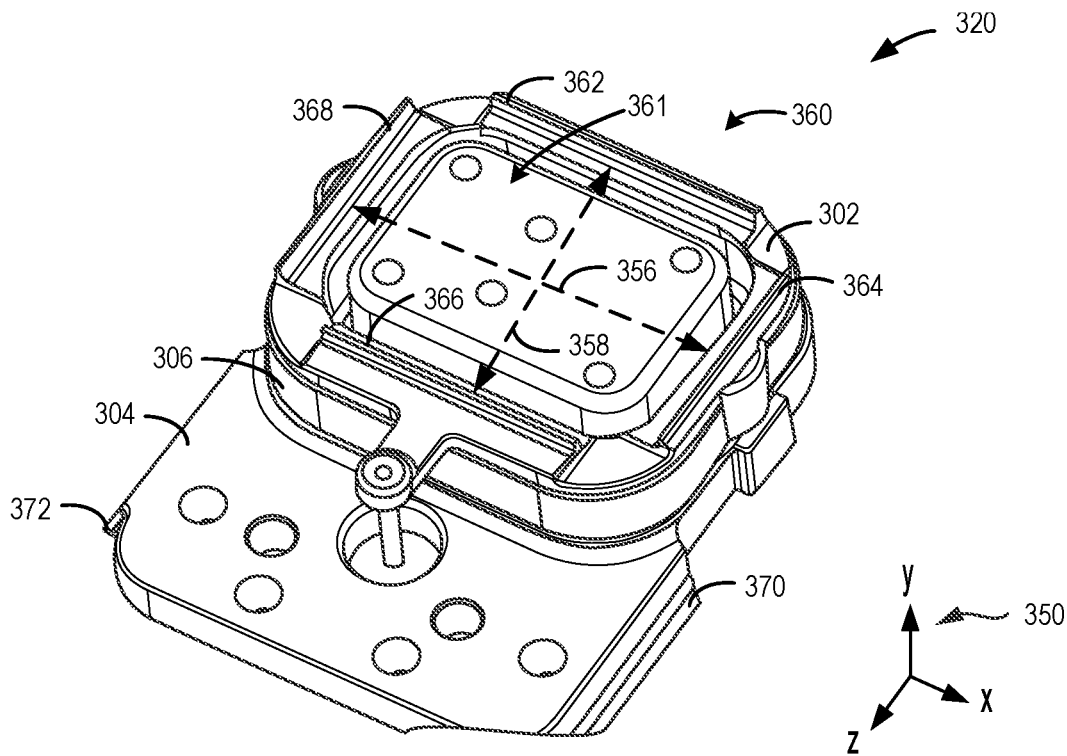
Figure 3C:
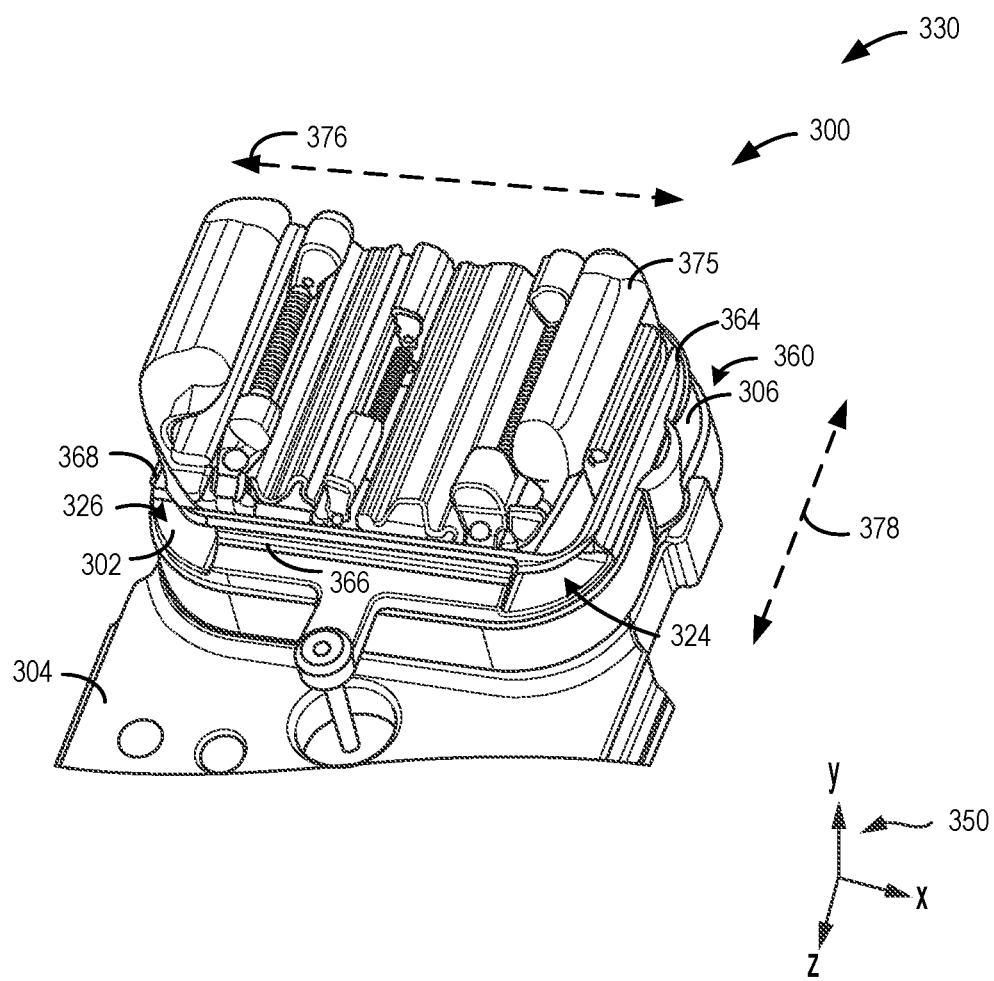
Figure 4:
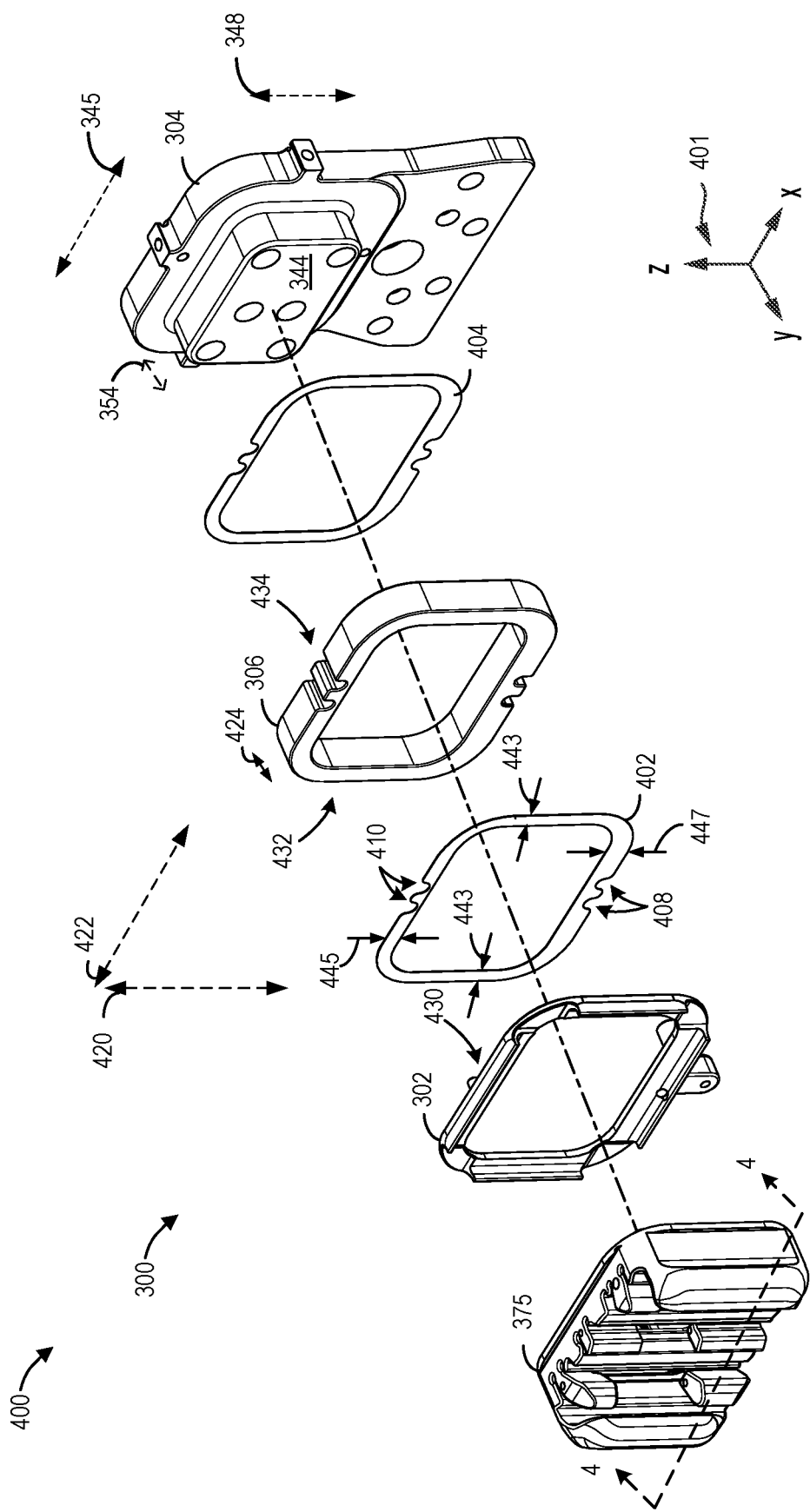
FIG. 4 shows an exploded view of elements of the cathode of FIGS. 3A-C.
Figure 5:
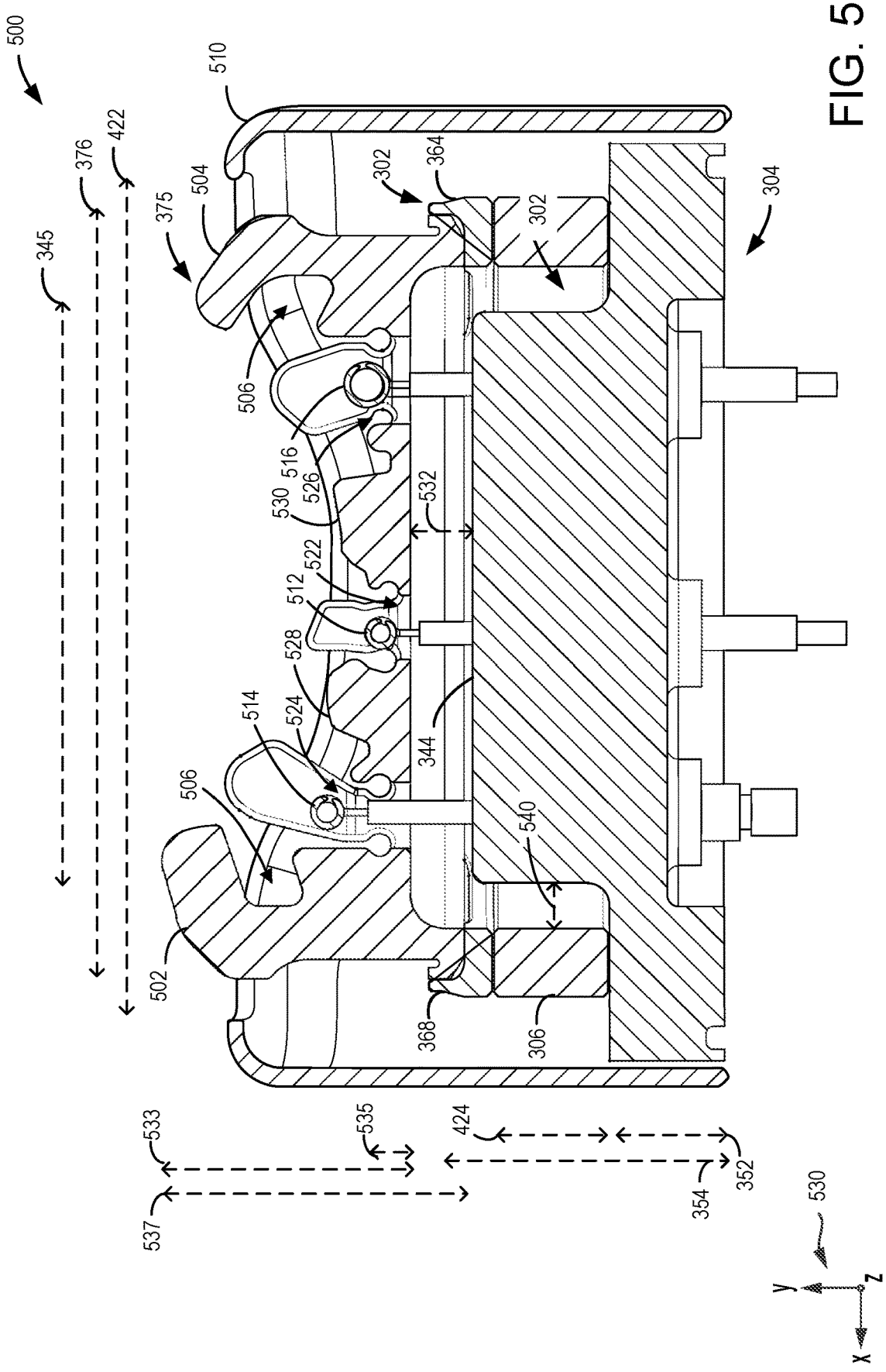
FIG. 5 shows a cross-sectional view of the cathode of FIGS. 3A-C.
Figure 6:
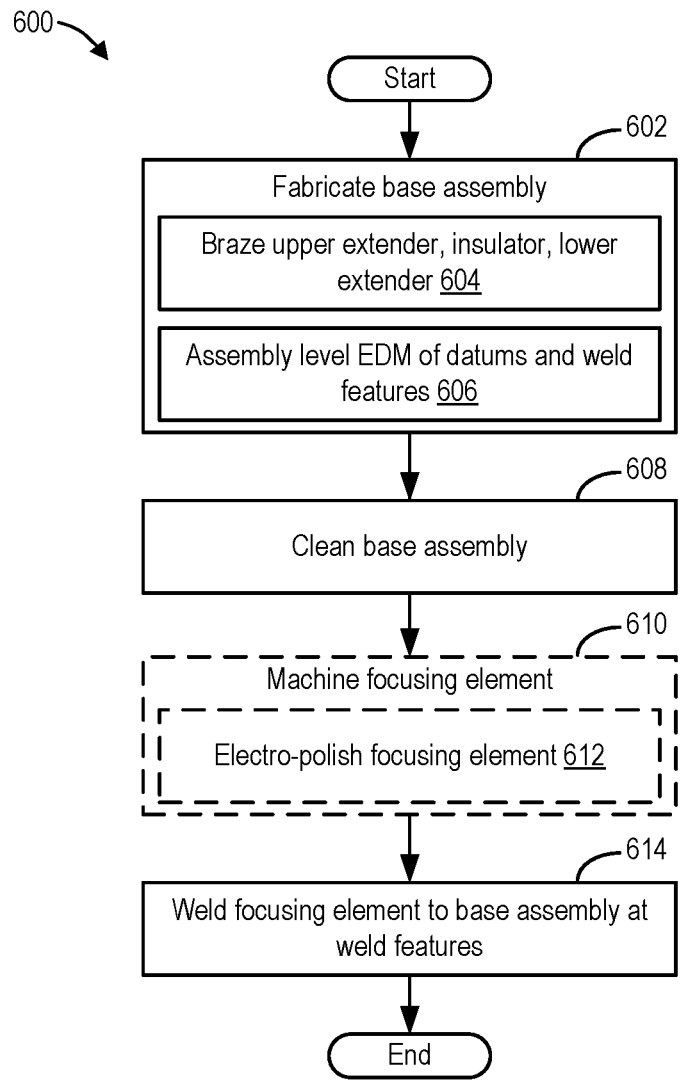
FIG. 6 illustrates a method for manufacturing the cathode of FIGS. 3A-5.

The X-ray imaging system includes an X-ray source (e.g., X-ray tube) to generate irradiating X-ray beams. A cross-sectional view of one example of the X-ray tube is shown in FIG. 2. The X-ray tube includes an anode assembly and a cathode assembly, wherein the cathode assembly includes the cathode for which a method of manufacturing is described herein. FIGS. 3A-C show a series of manufacturing stages of the cathode, including brazing together pieces of a base assembly, assembly level electrical discharge machining (EDM) of the base assembly to machine local datums and weld features, and welding of a focusing element onto weld features of the base assembly. An exploded view of elements of the cathode are shown in FIG. 4 and an example assembled cathode is shown in FIG. 5 in a cross-sectioned view. FIG. 6 illustrates a method for manufacturing the cathode of FIGS. 3A-5, including machining the base assembly, cleaning the base assembly, machining the focusing element, and welding the focusing element to the base assembly.

FIGS. 2-5 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example.

Before further discussion of the approach for fabricating a cathode wherein a focusing element is welded to a base assembly, an example imaging system in which the cathode may be implemented is shown. Turning now to FIG. 1, a block diagram is shown of an embodiment of an imaging system 10 configured both to acquire original image data and to process the image data for display and/or analysis in accordance with exemplary embodiments. It will be appreciated that various embodiments are applicable to numerous X-ray imaging systems implementing an X-ray tube, such as X-ray radiography (RAD) imaging systems, X-ray mammography imaging systems, fluoroscopic imaging systems, tomographic imaging systems, or CT imaging systems. The following discussion of the imaging system 10 is merely an example of one such implementation and is not intended to be limiting in terms of modality.

As shown in FIG. 1, imaging system 10 includes an X-ray tube or source 12 configured to project a beam of X-rays 14 through an object 16. The object 16 may include a human subject, pieces of baggage, or other objects desired to be scanned. The source 12 may be conventional X-ray tubes producing X-rays 14 having a spectrum of energies that range, typically, from thirty (30) keV to two hundred (200) keV. The X-rays 14 pass through the object 16 and, after being attenuated, impinge upon a detector assembly 18. Each detector module in the detector assembly 18 produces an analog electrical signal that represents the intensity of an impinging X-ray beam, and hence the attenuated beam, as it passes through the object 16. In one embodiment, detector assembly 18 is a scintillator based detector assembly, however, it is also envisioned that direct-conversion type detectors (e.g., CdTe, CZT, Si detectors, etc.) may also be implemented.

A processor 20 receives the signals from the detector assembly 18 and generates an image corresponding to the object 16 being scanned. A computer 22 communicates with the processor 20 to enable an operator, using an operator console 24, to control the scanning parameters and to view the generated image. That is, the operator console 24 includes some form of operator interface, such as a keyboard, mouse, voice activated controller, or any other suitable input apparatus that allows an operator to control the imaging system 10 and view the reconstructed image or other data from the computer 22 on a display unit 26. Additionally, the console 24 allows an operator to store the generated image in a storage device 28 which may include hard drives, floppy discs, compact discs, etc. The operator may also use the console 24 to provide commands and instructions to the computer 22 for controlling a source controller 30 that provides power and timing signals to the X-ray source 12.

FIG. 2 illustrates a cross-sectional view of an X-ray source 200 which may be included in the imaging system of FIG. 1. For example, the X-ray source 200 may be an exemplary embodiment of the X-ray source 12 of FIG. 1, formed of an X-ray tube 40 that includes an anode assembly 42 and a cathode assembly 44. A set of reference axes 201 are provided for comparison between views shown, indicating an x-axis, a y-axis, and a z-axis. The X-ray tube 40 is supported by the anode and cathode assemblies 42, 44 within an envelope or frame 46, which houses an anode 48 with a target 66, a bearing assembly 50, and a cathode 52. The frame 46 defines an area of relatively low pressure (e.g., a vacuum) compared to ambient, in which high voltages may be present. Further, the frame 46 may be positioned within a casing (not shown) filled with a cooling medium, such as oil, that may also provide high voltage insulation. While the anode 48 configured with the target 66 is described above as being a common component of the X-ray tube 40, the anode 48 and target 66 may be separate components in alternative X-ray tube embodiments.

In operation, an electron beam is produced by the cathode assembly 44. In particular, the cathode 52 receives one or more electrical signals via a series of electrical leads 56. The electrical beam occupies a space 54 between the cathode 52 and the target 66 of the anode 48. The electrical signals may be timing/control signals that cause the cathode 52 to emit the electron beam at one or more energies and at one or more frequencies. The electrical signals may also at least partially control the potential between the cathode 52 and the anode 48. The cathode 52 includes a central insulating shell 58 from which a mask 60 extends. The mask 60 encloses electrical leads 56, which extend to a cathode cup 62 mounted at the end of the mask 60. In some embodiments, the cathode cup 62 serves as an electrostatic lens that focuses electrons emitted from a filament within the cathode cup 62 to form the electron beam.

The X-rays 64 are produced when high-speed electrons of the electron beam are suddenly decelerated when directed from the cathode 52 to the target 66 formed on the anode 48 via a potential difference therebetween of, for example, sixty thousand (60,000) volts or more in the case of CT applications. The X-rays 64 are emitted through a radiation emission passage 68 formed in the frame 46 toward a detector array, such as the detector assembly 18 of FIG. 1.

The anode assembly 42 includes a rotor 72 and a stator (not shown) located outside the X-ray tube 40 and surrounding the rotor 72 for causing rotation of the anode 48 during operation. The anode 48 is supported for rotation by a bearing assembly 50, which, when rotated, also causes the anode 48 to rotate about a centerline 70 thereof. As such, the centerline 70 defines a rotational axis of the anode 48 and the bearing assembly 50. As shown, the anode 48 has an annular shape, which contains a circular opening 74 in the center thereof for receiving the bearing assembly 50.

The anode 48 may be manufactured to include a number of metals or alloys, such as tungsten, molybdenum, copper, or any material that contributes to bremsstrahlung (e.g., deceleration radiation) when bombarded with electrons. The target 66 of the anode 48 may be selected to have a relatively high refractory value so as to withstand the heat generated by electrons impacting the anode 48. Further, the space between the cathode assembly 44 and the anode 48 may be evacuated in order to minimize electron collisions with other atoms and to maximize an electric potential.

To avoid overheating of the anode 48 when bombarded by the electrons, the rotor 72 rotates the anode 48 at a high rate of speed (e.g., 90 to 250 Hz) about the centerline 70. In addition to the rotation of the anode 48 within the frame 46, in a CT application, the X-ray tube 40 as a whole is caused to rotate about an object, such as the object 16 of the imaging system 10 in FIG. 1, at rates of typically 1 Hz or faster.

Different embodiments of the bearing assembly 50 can be formed, such as with a number of suitable ball bearings, but in the illustrated exemplary embodiment comprises a liquid metal hydrodynamic bearing having adequate load-bearing capability and acceptable acoustic noise levels for operation within the imaging system 10 of FIG. 1.

In general, the bearing assembly 50 includes a stationary component, such as a center shaft 76, and a rotating portion, such as a sleeve 78 to which the anode 48 is attached. While the center shaft 76 is described with respect to FIG. 2 as the stationary component of the bearing assembly 50 and the sleeve 78 is described as the rotating component of the bearing assembly 50, embodiments of the present disclosure are also applicable to embodiments wherein the center shaft 76 is a rotary shaft and the sleeve 78 is a stationary component. In such a configuration, the anode 48 would rotate as the center shaft 76 rotates.

The center shaft 76 may optionally include a cavity or coolant flow path 80 though which a coolant (not shown), such as oil, may flow to cool bearing assembly 50. As such, the coolant enables heat generated from the anode 48 of the X-ray tube 40 to be extracted therefrom and transferred external from the X-ray tube 40. In straddle mounted X-ray tube configurations, the coolant flow path 80 extends along a longitudinal length of the X-ray tube 40, e.g., along the centerline 70. In alternative embodiments, the coolant flow path 80 may extend through only a portion of the X-ray tube 40, such as in configurations where the X-ray tube 40 is cantilevered when placed in an imaging system.

As described above, a method for manufacturing a smart cathode, herein referred to as "cathode", may be desired for fabricating a cathode with increased high-voltage stability, increased useable lifetime, increased options for focusing feature geometries, and increased focusing ranges. A method described herein for fabricating a cathode for an imaging system comprises machining a plurality of focusing features on a focusing element and welding the focusing element to a base assembly. The herein described method may thus result in a focal spot biasing electrode (e.g., the focusing element) in a smart cathode for increased reliability and emission performance.

The base assembly may be fabricated by brazing an upper extender to a first face of an insulator and brazing a lower extender to a second face of the insulator, opposite the first face of the insulator. Weld features and local datums may be machined on the base assembly using EDM. The base assembly with weld features and local datums may be cleaned, for example, by grit blasting. Surfaces of the base assembly, including surfaces of the insulator, may thus be cleaned prior to welding of the focusing element to the base assembly. The focusing element may be machined, either by a manufacturer of the cathode or by a third party, where machining of the focusing element includes machining focusing features having rounded edges and smooth geometries. The focusing element may then be electro-polished to increase a high-level voltage stability of the focusing element. The focusing element is then welded to the base assembly along weld features of the base assembly.

The method described briefly above and further herein may thus allow manufacturing of a cathode with increased reliability and emission performance. As focusing features of the focusing element are machined separately from EDM of the base assembly, focusing feature geometries with rounded edges, smooth geometries, and other geometries which may not be machined using EDM may be machined. A useable lifetime of the cathode may be increased due to cleaning of base assembly surfaces, including cathode surfaces, to remove braze overflow and recast layers from EDM. Electro-polishing of the focusing element prior to welding of the focusing element to the base assembly may increase high-voltage stability of the focusing element and, in addition to the rounded edges of the focusing features, may allow a height of the focusing element to extend beyond a height of the cathode cup, thus increasing a focusing ability of the cathode by increasing a number of potential focusing field size and/or shape options.

FIGS. 3A-C shows a series of manufacturing stages of a cathode, with an assembled cathode 300 shown in FIG. 3C. The cathode 300 may be an example of the cathode 50 of FIG. 2. A first manufacturing stage 310 of FIG. 3A and a second manufacturing stage 320 of FIG. 3B include assembling a base assembly 360 of the cathode. A third manufacturing stage 330 of FIG. 3C includes welding a focusing element to the base assembly 360 to form the cathode 300. Further detail regarding a method used to manufacture the cathode 300 shown in FIGS. 3A-C is described in FIG. 6. A set of reference axes 350 are provided for comparison between views shown, indicating an x-axis, a y-axis, and a z-axis.

The first manufacturing stage 310, shown in FIG. 3A, includes brazing a base assembly 360. The base assembly 360 includes an upper extender 302, a lower extender 304, and a weld pad 306. Each of the upper extender 302, the lower extender 304, and the weld pad 306 may be manufactured by the same party or by different parties. Further, the upper extender 302, the lower extender 304, and the weld pad 306 may be brazed together using torch brazing, induction brazing, resistance brazing, or another brazing method wherein the upper extender 302, the lower extender 304, and the weld pad 306 are joined by a filler metal.

The upper extender 302 is ring-shaped with rounded corners connecting straight edges and a hollow center. The upper extender may be formed of a metal such as, for example, nickel, steel, Kovar, or Niobium. The upper extender may include a first edge 312, a second edge 314, a third edge 316 and a fourth edge 318. A length of the first edge 312 may be equal to a length of the third edge 316, and a length of the second edge 314 may be equal to a length of the fourth edge 318. The length of the first edge 312 and the length of the third edge 316 along the x-axis may be greater than the length of the second edge 314 and the length of the fourth edge 318 along the z-axis. A width of each of the first edge 312 and the third edge 316 along the z-axis and a width of the second edge 314 and the fourth edge 318 along the z-axis may be approximately equal.

The rounded corners may include a first curved space 322 between the first edge 312 and the second edge 314, a second curved space 324 between the second edge 314 and the third edge 316, a third curved space 326 between the third edge 316 and the fourth edge 318, and a fourth curved space 328 between the fourth edge 318 and the first edge 312.

An architecture of the upper extender 302 may include a weld base positioned along each of the edges of the upper extender. For example, a first weld base 332 may be positioned along the length of the first edge 312, a second weld base 334 may be positioned along the length of the second edge 314, a third weld base 336 may be positioned along the length of the third edge 316, and a fourth weld base 338 may be positioned along the length of the fourth edge 318.

Each of the weld bases may have a stepped geometry, where a first step is aligned with an interior of the ring-shaped upper extender 302. Described another way, the first step may be aligned with a center, hollow portion of the ring-shaped upper extender 302. Each of the first steps of the weld bases may have a first height along the y-axis. For example, a first height of a first step of the first weld base 332 is equal to a first height of a first step of the second weld base 334. Each of the weld bases may further have a second step, where a second step of the first weld base 332, a second step of the second weld base 334, and a second step of the fourth weld base 338 are each aligned with exterior edges of the ring-shaped upper extender 302. A second step of the third weld base 336 may be positioned along the length of the third edge 316 in the approximate middle of the width of the third edge 316. A height of each of the second step of the first weld base, the second weld base, the third weld base, and the fourth weld base may be equal and the height may be greater than the first height of each of the first steps.

The weld pad 306 may be a ring-shaped insulator formed of ceramic or other insulating material which sufficiently insulates the upper extender 302 from the lower extender 304, and is herein referred to as the insulator 306. The insulator 306 may be positioned between the upper extender 302 and the lower extender 304 and circumferentially surrounding a second level of the lower extender. The insulator 306 may have a length and width similar to the length and width of the upper extender 302, respectively. The insulator 306 may further have a height along the y-axis, which may be greater than a total height of the upper extender 302, as further described in FIG. 4.

A first face of the upper extender 302 may be brazed to a first face of the insulator 306. Further, a second face of the insulator, opposite the first face of the insulator, may be brazed to the lower extender 304. For example, the upper extender 302, the lower extender 304, and the weld pad 306 may be brazed together using torch brazing, induction brazing, resistance brazing, or another brazing method wherein the upper extender 302, the lower extender 304, and the weld pad 306 are joined by a filler metal.

The lower extender 304 may have a continuous, stepped architecture including a first level 342 and a second level 344. The first level 342 may define a first length 346 and a first width 345 of the lower extender 304. The second level 344 may define a second length 348 and a second width 347 of the lower extender, wherein the second length 348 and second width 347 are less than the first length 346 and first width 345. The second level 344 may have a second height 354 greater than a first height 352 of the first level 342, such that the second level 344 extends through hollow portions of the insulator 306 and the upper extender 302. A top surface of the second level 344 may be aligned with the first height of the first steps of each of the weld bases 332, 334, 336, and 338 of the upper extender 302. The insulator 306 may thus be positioned between the upper extender 302 and the lower extender 304 and circumferentially surround the second level 344 of the lower extender 304.

A second manufacturing stage 320, shown in FIG. 3B, includes assembly level EDM of local datums and weld features on the base assembly 360. Weld features are machined on each of the first weld base 332, the second weld base 334, the third weld base 336, and the fourth weld base 338 of the upper extender 302. Each of a first weld feature 362, a second weld feature 364, a third weld feature 366, and a fourth weld feature 368 (e.g., corresponding to the first through fourth weld bases, respectively) may have an L-shaped geometry, where the first height of the first step (e.g., of the respective weld base) is reduced and a width of the second step (e.g., of the respective weld base) is reduced using EDM. The reduced first height of the first step is herein referred to as a third height. The reduced width of the second step is herein referred to as a fourth width for the first weld feature 362 and the third weld feature 366 along the z-axis, and a fifth width for the second weld feature 364 and the fourth weld feature 368 along the x-axis. The third height of each weld feature may be less than the fourth or the fifth width of the respective weld feature. Machining weld features from weld bases of the upper extender 302 using EDM may result in a space 361 on a top of the base assembly 360 with a sixth width 356 along the z-axis and a seventh length 358 along the x-axis such that the focusing element may be positioned inside the space, as shown in FIG. 3C. The third height of each weld feature of the upper extender may partially surround the focusing element, as further described below.

Assembly level EDM of local datums may include machining a first datum 370 and a second datum 372. The first datum 370 and the second datum 372 allow for attaching cathode shielding (e.g., at the lower extender 304) to a refractory cup assembly (e.g., cathode cup shown in FIG. 5), via welding.

A third manufacturing stage 330, shown in FIG. 3C, includes welding the focusing element 375 to the base assembly 360 at the weld features. For example, the focusing element 375 is coupled to the base assembly along the weld features of the base assembly by a weld coupling (e.g., welded metal). The focusing element 375 includes focusing features, channels with filaments positioned therein, and other geometries and architectures for emitting and focusing electrons into a single electron beam to impact the anode and produce X-ray beams, as described above. Further details of the focusing element 375 are described in FIG. 5. Continuing with FIG. 3C, the focusing element 375 has an eighth width 376 along the x-axis and a ninth length 378 along the z-axis. The eighth width 376 and the ninth length 378 of the focusing element 375 may be less than the seventh length 358 and the sixth width 356, respectively (depicted in FIG. 3B). The focusing element 375 may thus be positioned within the space formed by the weld features of the upper extender 302, and a base of the focusing element 375 may rest on the weld features, as further shown in FIG. 5.

The focusing element 375 is welded to the base assembly 360 at each of the weld features of the base assembly. In one example, welding is done using laser welding. However, other suitable welding methods may be used which allow coupling of the base assembly to the focusing element without thermal deformation (e.g., melting or other degradation) of the focusing element and/or the base assembly. The focusing element 375 is welded to the base assembly 360 along the first weld feature 362 (not specifically shown in FIG. 3C), the second weld feature 364, the third weld feature 366, and the fourth weld feature 368. A weld coupling along each of the weld features may couple the focusing element and the respective weld features along the lengths of each of the first weld feature 362, the second weld feature 364, the third weld feature 366, and the fourth weld feature 368. As the weld features are positioned away from focusing features of the focusing element, thermal deformation of the focusing features during the welding process may be reduced.

Welding is halted at each of the curved spaces between the weld features. For example, a gap in the weld is present at the first curved space (e.g., the first curved space 322 shown in FIG. 3A), the second curved space 324, the third curved space 326, and the fourth curved space (e.g., the fourth curved space 328 shown in FIG. 3A). A height of the gap may be equal to the third height (e.g., of the first step of the weld feature). The gap in the weld at each curved space between welds at the weld features may allow for expansion of the welds and other metal features of the cathode when heated, such that a likelihood of degradation of the weld due to stress is decreased.

The cathode 300 manufactured as described using the steps shown in FIGS. 3A-3C may be implemented in an X-ray tube of an imaging system, such as the X-ray tube of FIG. 2. The steps of FIGS. 3A-C are elaborated on in the method of FIG. 6. Before further discussion of the approach for fabricating the cathode wherein the focusing element is welded to the base assembly, an exploded view of elements of the cathode is shown in FIG. 4, and a cross-sectional view of the cathode is shown in FIG. 5.

FIG. 4 shows an exploded view 400 of elements of the cathode 300 of FIGS. 3A-C. Like components are numbered similarly as in FIGS. 3A-C. In addition to the previously described focusing element 375, upper extender 302, insulator 306, and lower extender 304, the cathode 300 may also include a first braze foil 402 and a second braze foil 404. The first braze foil 402 and the second braze foil 404 are used to couple the insulator 306 (e.g., formed of ceramic or other insulating material) to the upper extender 302 and the lower extender 304 via brazing, as previously described in FIGS. 3A-C and further described in FIG. 6. A set of reference axes 401 are provided for comparison between views shown, indicating an x-axis, a y-axis, and a z-axis.

As described above, the insulator 306 may have a length and width similar to the length and width of the upper extender 302, respectively. A length and a width of the first braze foil 402 and the second braze foil 404 may also be equal to the length and the width, respectively, of the insulator 306 and the upper extender 302. As such, the length of the first braze foil 402, the second braze foil 404, the insulator 306, and the upper extender 302 may equal a tenth length 420. Further, the width of the first braze foil 402, the second braze foil 404, the insulator 306, and the upper extender 302 may equal an eleventh width 422. The tenth length 420 and the eleventh width 422 may be greater than the first width 345 and the second length 348 of the second level of the lower extender 304, respectively.

The insulator 306 may further have a height 424 along the y-axis, as measured between a first face 432 and a second face 434 of the insulator 306, which may be greater than the total height of the upper extender 302 and approximately equal to the second height 354 of the second level 344 (depicted in FIG. 3A). Thus, when the insulator 306 is positioned between the upper extender 302 and the lower extender 304, a first face 430 of the upper extender 302 may rest on the first face 432 of the insulator 306 (e.g., with the first braze foil 402 positioned therebetween) and the second face 434 of the insulator 306, opposite the first face 432 of the insulator 306, may rest on the lower extender 304 (e.g., with the second braze foil 404 positioned therebetween).

In one example, the insulator 306, the first braze foil 402, and the second braze foil 404, may also be configured with two pairs of cutouts 408, 410 for locating dowels. The locating dowels may be positioned on at least one of the lower extender 304 and the upper extender 302 such that, when the upper extender 302, the first braze foil 402, the insulator 306, the second braze foil 404, and the lower extender 304 are positioned as shown in FIG. 3C (e.g., in an assembled configuration of the cathode 300), locating dowels extend into the pairs of cutouts 408, 410 to provide integral fixturing for the cathode. In one example, the two pairs of cutouts 408, 410 may be centered along the width 422 of each element and may span the height 424 of the insulator 306 and a height of the first braze foil 402 and the second braze foil 404, where the height of the braze foils is less than the height of the upper extender. The locating dowels extending through the cutouts 408, 410 may couple the upper extender 302, the insulator 306, and the lower extender 304. The first braze foil 402 may be sandwiched between the upper extender 302 and the insulator 306. The second braze foil 404 may be sandwiched between the insulator 306 and the lower extender 304. A distance between the upper extender 302 and the lower extender 304 may equal the height 424 of the insulator 306.

Both the first braze foil 402 and the second braze foil 404, may be configured with similar dimensions and geometry to each other, the upper extender 302, the insulator 306, and the lower extender 304, including the tenth length 420 and the eleventh width 422. The first braze foil 402 and the second braze foil 404 may be ring-like structures with similar inner dimensions as the insulator 306 and the upper extender 302, with a first wall thickness 447, a second wall thickness 445, and a third wall thickness 443. The first wall thickness 447 may be greater than the second wall thickness 445, and the second wall thickness may be greater than the third wall thickness 443. The ring-like structure may allow the second level 344 of the lower extender 304 to protrude through the centers of the second braze foil 404, the insulator 306, and the first braze foil 402. In one example, the top of the second level 344 may be flush with the top of the first braze foil 402. In another example, the second level 344 may extend through the upper extender 302, as further shown in FIG. 5.

FIG. 5 shows a cross-sectional view 500 of the cathode 300 of FIGS. 3A-C, as defined by a lateral cut taken along a dashed line 4-4 in FIG. 4. Like components are numbered similarly as in FIGS. 3A-4 and include the focusing element 375, the upper extender 302, the insulator 306, and the lower extender 304. The embodiment shown in FIG. 5 further includes a cathode cup 510, which may be an example of the cathode cup 62 of FIG. 2.

The cathode cup 510 may serve as an electrostatic lens that focuses electrons emitted from a thermionic filament within the cathode cup to form an electron beam. The cathode cup 510 may be a hollow rectangular shell formed of a metal such as, for example, nickel or Kovar, with an open top and an open bottom surrounding the upper extender 302, the insulator 306, the lower extender 304, and at least part of the focusing element 375, to be further described below.

The focusing element 375 may be a single continuous architecture with at least one channel sized such that a thermionic filament may be positioned therein, and with at least one focusing feature on either lateral side of the at least one channel, as shown in FIGS. 3A-4. In one example, the focusing element 375 may be machined using EDM and five-axis mill machining. Focusing features and channels of the focusing element may have rounded corners and edges and smooth geometry, as opposed to corners which meet at a linear angle. Other methods may be used to machine the focusing element which allow for rounded edges and smooth geometry.

The focusing element 375 may be configured as a continuous single architecture (e.g., a monolithic structure) gridding electrode with electron emitting filaments positioned in each of at least three channels with geometry to focus emitted electrons into a single electron beam. The focusing element 375 may have a bowl shape, e.g., the sides of the focusing element may have a taller height compared to a center of the focusing element. For example, the focusing element may have a first side height 533 greater than a second interior height 535.

The focusing element geometry may include a first lateral edge feature 502 and a second lateral edge feature 504 on opposite ends of the eighth width 376. Each of the first lateral edge feature 502 and the second lateral edge feature 504 may be configured with a lateral recess 506, which may assist in focusing the electron beam. Each lateral recess 506 of the first lateral edge feature 502 and the second lateral edge feature 504 is positioned at a vertical height greater than a vertical height of an adjacent filament, where the recess vertical height is defined as a distance from a bottom point of the recess to a face of the focusing element 375 adjacent to the upper extender 302. Edges of the lateral recess 506 may be rounded.

The focusing element 375 may further include at least one thermionic filament positioned in a channel of the focusing element architecture. In the embodiment of FIG. 4, a small filament 512 is positioned in a first channel 522, a medium filament 514 is positioned in a second channel 524, and a large filament 516 is positioned in a third channel 526. Each of the small filament 512, the medium filament 514, and the large filament 516 may be positioned at a different height within the respective channel with respect to the top of the second level of the lower extender 304. Each filament may be positioned approximately at the center of the respective channel with regards to the channel width.

Additional focusing features may be positioned between each of the channels along the eighth width 376 of the focusing element 375, which may extend along the ninth length 378 of the focusing element 375, as shown in FIGS. 3C-4.

A first focusing feature 528 is positioned between the second channel 524 and the first channel 522, and a second focusing feature 530 is positioned between the first channel 522 and the third channel 526. Each of the first focusing feature 528 and the second focusing feature 530 may be configured with a geometry to focus the electrons emitted from the filaments on either side into the single electron beam for the focusing element 375. The channels may thus be spaced apart by a width of the focusing features between the respective channels. As the filaments are centered in the respective channel width, as described above, a distance between each filament may be greater than the distance between each channel. The first lateral edge feature 502, the second lateral edge feature 504, the first focusing feature 528, and the second focusing feature 530 are configured as a continuous, single architecture of the focusing element 375. The first lateral edge feature 502 and the second lateral edge feature 504 may be herein referred to as focusing features.

The focusing element geometry for the focusing element 375, including channel walls, and focusing features is configured with integrated edge focusing, where edges of the focusing element are rounded, such as, for example, with a radius of at least 120 µm, as opposed to a sharp edge defined as having a radius of less than 80 µm, e.g., a 90-degree intersection of two straight planes. In one example, all edges of the focusing element geometry are configured as rounded edges. In one example, the focusing element may be machined using EDM and five-axis mill machining. Focusing features and channels of the focusing element thus have rounded corners and edges and smooth geometry, as opposed to corners which meet at a linear angle. Other methods may be used to machine the focusing element which allow for rounded edges and smooth geometry.

The focusing element 375 may be configured with a hollow space 532 below the plane of the filaments, through which insulated legs of the filaments may pass. As the filaments are charged with a voltage via current feedthroughs to heat the filament and emit electrons, the legs of each filament may be insulated, for example, by leg insulators, to minimize charge lost to the environment and isolate a current feedthrough charge from a charge imparted on the focusing element 375, a charge of the upper extender 302, and a charge of the lower extender 304.

The hollow region provides a gap region between the focusing element 375 and the top of the second level 344 of the lower extender 304. Further, due to the first width 345 of the second level of the lower extender 304 being less than the eleventh width 422 of the insulator 306 and the upper extender 302, and less than the eighth width 376 of the focusing element 375, the gap region extends around sides of the second level 344 of the lower extender 304. A lateral gap 540 is thus present between the second level 344 of the lower extender 304 and the insulator 306, the second level 344 and the upper extender 302, and second level 344 and the focusing element 375 (e.g., around a circumference of the second level 344). A width of the lateral gap 540 between the second level and the upper extender 302 is equal to a width of the lateral gap 540 between the insulator 306 and the second level. The lateral gap 540 having a first width of equal distance around a circumference of the second level. The lateral gap 540 may be rounded between second level 344 and the focusing element 375, such that a width of the lateral gap 540 between the second level 344 and the focusing element 375 is less than the width of the lateral gap 540 between the insulator 306 and the second level.

As described above, the filaments may be spaced apart laterally by a width of the focusing features. Each of the filament of the first channel, the filament of the second channel, and the filament of the third channel has an unequal lateral spacing with regards to adjacent filaments, wherein lateral spacing is defined as a lateral distance, with regards to a horizontal axis (e.g., the x-axis), between a center point of a first filament diameter to a center point of a second filament diameter. Specifically, the small filament 512, which may be positioned between the medium filament and the large filament, may be offset from the center of the total width (e.g., equal to the eighth width 376) of the focusing element 375. Ions emitted from the electron beam impacting the anode target, such as the target 66 of the anode 48 of FIG. 2, may be most likely to impact the center of the focusing feature. Therefore, by positioning the small filament to the left of a center point of the focusing feature, potential degradation of the filament may be prevented.

Furthermore, a height 537 of the focusing element 375 may extend at least partially above the height of the cathode cup 510. As described above, the focusing element 375 is electro-polished prior to being welded to the weld features of the upper extender 302, a high-voltage stability of the focusing element 375 may be increased. Focusing fields which may be directed by the focusing element 375 may thus be increased, as the focusing element may extend above a height of the cathode cup 510 with reduced degradation due to high-voltage.

FIG. 6 illustrates an example method 600 for manufacturing the cathode of FIGS. 3-5. The method 600 may be implemented by an X-ray imaging system manufacturer, by a cathode manufacturer, and so on.

At 602, method 600 includes fabricating a base assembly. The base assembly of the cathode may include an upper extender, a lower extender, and a weld pad, as shown in FIGS. 3-5. The weld pad may be a ring-shaped insulator formed of ceramic or other insulating material which sufficiently insulates the upper extender from the lower extender, and is herein referred to as the insulator. The insulator may be positioned between the upper extender and the lower extender and circumferentially surrounding a second level of the lower extender.

At 604, fabricating the base assembly includes brazing together the upper extender, the insulator, and the lower extender. A first face of the upper extender may be brazed to a first face of the insulator and a second face of the insulator, opposite the first face of the insulator, may be brazed to the lower extender. The upper extender, the lower extender, and the weld pad may be brazed together using torch brazing, induction brazing, resistance brazing, or another brazing method wherein the upper extender, the lower extender, and the weld pad are joined by a filler metal.

Fabricating the base assembly further includes, at 606, performing assembly level electrical discharge machining (EDM) of local datums and weld features. Local datums and weld features are machined on the upper extender of the base assembly. As shown in FIGS. 3-5, weld features are machined on each of a first edge, a second edge, a third edge, and a fourth edge of a second face of the upper extender, with a curved space between each of the weld features.

At 608, following brazing of the base assembly, the method 600 includes cleaning the base assembly. The base assembly is cleaned to remove potential braze overflow and/or a recast layer from the EDM process. In one example, cleaning is done by grit blasting the base assembly. As the focusing element has not yet been attached (e.g., welded) to the base assembly, the insulator as well as the upper extender and the lower extender may be cleaned of braze overflow and EDM recast layers.

Method 600 may optionally include machining a focusing element at 610. Machining the focusing element may include machining a single continuous architecture with at least one channel sized such that a filament may be positioned therein and at least one focusing feature on either lateral side of the at least one channel, as shown in FIGS. 3-5. In one example, the focusing element may be machined using EDM and five-axis mill machining. Focusing features and channels of the focusing element may have rounded corners and edges and smooth geometry, as opposed to corners which meet at a linear angle. Other methods may be used to machine the focusing element which allow for rounded edges and smooth geometry. In another example, the focusing element is manufactured by a third party and may include a similar architecture (e.g., at least one channel with at least one focusing feature on either lateral side) or different architecture from the architecture described above.

Machining the focusing element may further include electro-polishing the focusing element at 612. Electro-polishing the focusing element may increase a high-voltage stability of the focusing element. The high-voltage stability may allow focusing features of the focusing element to extend above a height of a cathode cup, as shown in FIG. 5. Extension of the focusing features above the height of the cathode cup may increase a focusing field of the cathode and increase an amount of electrons emitted from the filament which impact the anode.

At 614, method 600 includes welding the focusing element to the base assembly at weld features. The focusing element is welded to the base assembly at the weld features along the first edge, the second edge, the third edge, and the fourth edge of the second face of the upper extender. Welding is halted at each of a first curved space between the first edge and the second edge, a second curved space between the second edge and the third edge, a third curved space between the third edge and the fourth edge, and a fourth curved space between the fourth edge and the first edge, as shown in FIGS. 3-5. Welding of the focusing element to the base assembly may be performed using laser welding methods.

In this way, a cathode for an X-ray imaging system may be fabricated, wherein the focusing element is welded to the base assembly following cleaning of the base assembly and electro-polishing of the focusing element. This may allow for cleaning of the insulator of the base assembly, as well as the upper extender and the lower extender, which may increase a useable lifetime of the cathode. Additionally, machining the focusing element separately from machining the base assembly may allow for focusing element geometry that may increase focusing of electrons emitted from the filament(s) into a single electron beam. Electro-polishing the focusing element may increase high-voltage stability of the focusing element, further increasing a useable lifetime of the cathode and increasing focusing of emitted electrons. Welding the focusing element to the base assembly at weld features along the first edge, the second edge, the third edge, and the fourth edge, and not welding at curved spaces between the weld features, may allow for stress relief. For example, during welding of the focusing element to the base assembly and during operation of the cathode (e.g., emission of electrons from the filament(s)), the curved spaces between weld features may allow for expansion of the welds and other metal features of the cathode when heated, such that a likelihood of breaks due to stress is decreased.

The technical effect of a cathode for an imaging system as described herein, wherein the cathode includes a plurality of focusing features on a focusing element and the focusing element is welded to a base assembly including an insulator, is increased electron focusing ability of the cathode, high-voltage stability of the cathode, and increased yield of manufactured cathodes.

The disclosure also provides support for a method for fabricating a cathode for an X-ray imaging system, comprising: machining a plurality of focusing features on a focusing element, and welding the focusing element to a base assembly. In a first example of the method, the method further comprises: brazing an upper extender and a lower extender to a weld pad to form the base assembly, wherein a first face of the upper extender is coupled to a first face of the weld pad using filler metal and the lower extender is coupled to a second, opposite face of the weld pad using filler metal. In a second example of the method, optionally including the first example, the method further comprises: machining local datums and weld features on the upper extender of the base assembly. In a third example of the method, optionally including one or both of the first and second examples, local datums and weld features are machined using electrical discharge machining. In a fourth example of the method, optionally including one or more or each of the first through third examples, weld features are machined on each of a first edge, a second edge, a third edge, and a fourth edge of a second face of the upper extender, with a curved space between each of the weld features. In a fifth example of the method, optionally including one or more or each of the first through fourth examples, the focusing element is welded to the base assembly at weld features and welding is halted at each of a first curved space between the first edge and the second edge, a second curved space between the second edge and the third edge, a third curved space between the third edge and the fourth edge, and a fourth curved space between the fourth edge and the first edge. In a sixth example of the method, optionally including one or more or each of the first through fifth examples, the focusing element is welded to the upper extender using laser welding. In a seventh example of the method, optionally including one or more or each of the first through sixth examples, the method further comprises: cleaning the base assembly. In an eighth example of the method, optionally including one or more or each of the first through seventh examples, cleaning the base assembly includes grit blasting the base assembly. In a ninth example of the method, optionally including one or more or each of the first through eighth examples, the plurality of focusing features are machined on the focusing element using electrical discharge machining and five-axis mill machining, such that the plurality of focusing features have rounded corners and smooth geometry. In a tenth example of the method, optionally including one or more or each of the first through ninth examples, the method further comprises: electro-polishing the focusing element.

The disclosure also provides support for a cathode for an X-ray imaging system, comprising: a base assembly, a plurality of focusing features on a focusing element, and a weld coupling, wherein the focusing element is coupled to the base assembly by the weld coupling. In a first example of the system, the system further comprises: a cathode cup circumferentially surrounding the base assembly and a first height of the focusing element, where a second height of the focusing element extends above a height of the cathode cup. In a second example of the system, optionally including the first example, the base assembly is comprised of a lower extender brazed to a first face of an insulator using a filler metal, and an upper extender brazed to a second, opposite face of the insulator using the filler metal. In a third example of the system, optionally including one or both of the first and second examples, the lower extender has a stepped architecture, where a second level extends vertically from a portion of a first level such that a height of the second level is at least partially circumferentially surrounded by the insulator. In a fourth example of the system, optionally including one or more or each of the first through third examples, the system further comprises: a first lateral gap between the second level and the insulator having a first width around a circumference of the second level, and a second lateral gap between the second level and the upper extender with a second width equal to the first width of the first lateral gap. In a fifth example of the system, optionally including one or more or each of the first through fourth examples, the system further comprises: a distance between the upper extender and lower extender being greater than or equal to a height of the insulator. In a sixth example of the system, optionally including one or more or each of the first through fifth examples, the weld coupling couples the focusing element to the base assembly along weld features positioned along a first edge, a second edge, a third edge, and a fourth edge of the upper extender. In a seventh example of the system, optionally including one or more or each of the first through sixth examples, a gap is present in the weld coupling at each of a first curved space between the first edge and the second edge, a second curved space between the second edge and the third edge, a third curved space between the third edge and the fourth edge, and a fourth curved space between the fourth edge and the first edge.

The disclosure also provides support for a method for manufacturing a cathode, comprising: fabricating a base assembly, including: brazing a first face of an upper extender to a first face of an insulator using filler metal, brazing a lower extender to a second face of the insulator, opposite the first face of the insulator, using filler metal, machining weld features on each of a first edge, a second edge, a third edge, and a fourth edge of a second face of the upper extender, opposite the first face of the upper extender, with a curved space between each of the weld features, using electrical discharge machining, and machining datums on the base assembly, cleaning the base assembly by grit blasting the base assembly, machining a focusing element with a plurality of focusing features and at least one channel, electro-polishing the focusing element, positioning a thermionic filament in each of the at least one channel, welding a first face of the focusing element to the second face of the upper extender at each of the weld features along the first edge, the second edge, the third edge, and the fourth edge, and halting welding at each of a first curved space between the first edge and the second edge, a second curved space between the second edge and the third edge, a third curved space between the third edge and the fourth edge, and a fourth curved space between the fourth edge and the first edge.

As used herein, an element or step recited in the singular and preceded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property. The terms "including" and "in which" are used as the plain-language equivalents of the respective terms "comprising" and "wherein." Moreover, the terms "first," "second," and "third," etc. are used merely as labels, and are not intended to impose numerical requirements or a particular positional order on their objects.

This written description uses examples to disclose the invention, including the best mode, and also to enable a person of ordinary skill in the relevant art to practice the invention, including making and using any devices or systems and performing any incorporated methods. The patentable scope of the invention is defined by the claims, and may include other examples that occur to those of ordinary skill in the art. Such other examples are intended to be within the scope of the claims if they have structural elements that do not differ from the literal language of the claims, or if they include equivalent structural elements with insubstantial differences from the literal languages of the claims.

The invention claimed is:

1. A method for fabricating a cathode for an X-ray imaging system, comprising:
   machining a plurality of focusing features on a focusing element; and
   welding the focusing element to a base assembly,
   wherein weld features are machined on each of a first edge, a second edge, a third edge, and a fourth edge of a second face of an upper extender, with a curved space between each of the weld features, and
   wherein the focusing element is welded to the base assembly at the weld features and welding is halted at each of a first curved space between the first edge and the second edge, a second curved space between the second edge and the third edge, a third curved space between the third edge and the fourth edge, and a fourth curved space between the fourth edge and the first edge.

2. The method of claim 1, further comprising brazing the upper extender and a lower extender to a weld pad to form the base assembly, wherein a first face of the upper extender is coupled to a first face of the weld pad using filler metal and the lower extender is coupled to a second, opposite face of the weld pad using filler metal.

3. The method of claim 1, wherein the focusing element is welded to the upper extender using laser welding.

4. The method of claim 1, further comprising cleaning the base assembly.

5. The method of claim 4, wherein cleaning the base assembly includes grit blasting the base assembly.

6. The method of claim 1, wherein the plurality of focusing features are machined on the focusing element using electrical discharge machining and five-axis mill machining, such that the plurality of focusing features have rounded corners and smooth geometry.

7. The method of claim 1, further comprising electro-polishing the focusing element.

8. A cathode for an X-ray imaging system, comprising:
   a base assembly;
   a plurality of focusing features on a focusing element;
   a weld coupling;
   wherein the focusing element is coupled to the base assembly by the weld coupling,
   wherein the base assembly is comprised of a lower extender brazed to a first face of an insulator using a filler metal, and an upper extender brazed to a second, opposite face of the insulator using the filler metal, and
   wherein the lower extender has a stepped architecture, and wherein a second level of the stepped architecture extends vertically from a portion of a first level of the stepped architecture such that a height of the second level is at least partially circumferentially surrounded by the insulator;
   a first lateral gap between a second level and the insulator having a first width around a circumference of the second level; and
   a second lateral gap between the second level and the upper extender with a second width equal to the first width of the first lateral gap.

9. The cathode of claim 8, further comprising a cathode cup circumferentially surrounding the base assembly and a first height of the focusing element, wherein a second height of the focusing element extends above a height of the cathode cup.

10. The cathode of claim 8, further comprising a distance between the upper extender and lower extender being greater than or equal to a height of the insulator.

11. The cathode of claim 8, wherein the weld coupling couples the focusing element to the base assembly along weld features positioned along a first edge, a second edge, a third edge, and a fourth edge of the upper extender.

12. The cathode of claim 11, wherein a gap is present in the weld coupling at each of a first curved space between the first edge and the second edge, a second curved space between the second edge and the third edge, a third curved space between the third edge and the fourth edge, and a fourth curved space between the fourth edge and the first edge.

13. A method for manufacturing a cathode, comprising:
   fabricating a base assembly, including:
      brazing a first face of an upper extender to a first face of an insulator using filler metal;
      brazing a lower extender to a second face of the insulator, opposite the first face of the insulator, using filler metal;
      machining weld features on each of a first edge, a second edge, a third edge, and a fourth edge of a second face of the upper extender, opposite the first face of the upper extender, with a curved space between each of the weld features, using electrical discharge machining; and
      machining datums on the base assembly;
   cleaning the base assembly by grit blasting the base assembly;
   machining a focusing element with a plurality of focusing features and at least one channel;
   electro-polishing the focusing element;
   positioning a thermionic filament in each of the at least one channel;
   welding a first face of the focusing element to the second face of the upper extender at each of the weld features along the first edge, the second edge, the third edge, and the fourth edge; and
   halting welding at each of a first curved space between the first edge and the second edge, a second curved space between the second edge and the third edge, a third curved space between the third edge and the fourth edge, and a fourth curved space between the fourth edge and the first edge.

\* \* \* \* \*